United States Patent
Lee et al.

(10) Patent No.: US 11,004,517 B2
(45) Date of Patent: May 11, 2021

(54) STORAGE DEVICE INCLUDING NONVOLATILE MEMORY DEVICE AND OPERATING METHOD THEREOF

(71) Applicant: Samsung Electronics Co., Ltd., Suwon-si (KR)

(72) Inventors: Yunjung Lee, Suwon-si (KR); Chanha Kim, Hwaseong-si (KR); Suk-eun Kang, Hwaseong-si (KR); Seungkyung Ro, Anyang-si (KR); Kwangwoo Lee, Seoul (KR); Juwon Lee, Hwaseong-si (KR); Jinwook Lee, Seoul (KR); Heewon Lee, Seoul (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 29 days.

(21) Appl. No.: 16/356,182

(22) Filed: Mar. 18, 2019

(65) Prior Publication Data
US 2020/0058359 A1    Feb. 20, 2020

(30) Foreign Application Priority Data
Aug. 14, 2018  (KR) .................. 10-2018-0094844

(51) Int. Cl.
| G11C 16/04 | (2006.01) |
| G11C 16/26 | (2006.01) |
| G11C 16/34 | (2006.01) |
| G06F 3/06 | (2006.01) |
| G06F 11/10 | (2006.01) |
| G11C 29/52 | (2006.01) |
| G11C 11/56 | (2006.01) |

(52) U.S. Cl.
CPC ............ *G11C 16/26* (2013.01); *G06F 3/0604* (2013.01); *G06F 3/0659* (2013.01); *G06F 3/0679* (2013.01); *G06F 11/1068* (2013.01); *G11C 16/3495* (2013.01); *G11C 29/52* (2013.01); *G11C 11/5671* (2013.01); *G11C 16/0483* (2013.01)

(58) Field of Classification Search
CPC .................................................. G11C 11/5642
USPC ....................................................... 365/185.18
See application file for complete search history.

(56) References Cited

U.S. PATENT DOCUMENTS

| 8,467,249 | B2 | 6/2013 | Katz et al. |
| 9,244,763 | B1 | 1/2016 | Kankani et al. |
| 9,377,962 | B2 | 6/2016 | Cometti et al. |
| 9,576,671 | B2 | 2/2017 | Karakulak et al. |
| 9,785,357 | B2 * | 10/2017 | Raghu ............... G06F 3/061 |
| 9,916,237 | B2 * | 3/2018 | Hyun ............... G06F 3/0653 |
| 2017/0358346 | A1 | 12/2017 | Zhang et al. |
| 2018/0067697 | A1 * | 3/2018 | Lee ............... G11C 11/5642 |
| 2020/0019461 | A1 * | 1/2020 | Sugiyama ........... G11C 11/5642 |

* cited by examiner

*Primary Examiner* — Min Huang
(74) *Attorney, Agent, or Firm* — Harness, Dickey & Pierce, P.L.C.

(57) ABSTRACT

A storage device includes a nonvolatile memory device including a memory block and a memory controller. The memory block includes a first memory region connected with a first word line and a second memory region connected with a second word line. The memory controller sets a read block voltage based on a first read voltage of the first memory region. The memory controller determines a second read voltage of the second memory region based on variation information and the read block voltage.

10 Claims, 11 Drawing Sheets

STORAGE DEVICE INCLUDING NONVOLATILE MEMORY DEVICE AND OPERATING METHOD THEREOF

CROSS-REFERENCE TO RELATED APPLICATIONS

This U.S. non-provisional application claims the benefit of priority under 35 U.S.C. § 119 to Korean Patent Application No. 10-2018-0094844 filed on Aug. 14, 2018, in the Korean Intellectual Property Office (KIPO), the disclosure of which is incorporated by reference herein in its entirety.

BACKGROUND

Various example embodiments of the inventive concepts disclosed herein relate to a device storing data, and more particularly, relate to a storage device including a nonvolatile memory device, a system including the storage device, and/or an operating method thereof.

A storage device (e.g., a solid state drive (SSD), etc.) includes a nonvolatile memory. Since the storage device retains data stored therein even after power-off (e.g., the power to the storage device has been turned off, etc.), it is advantageous to store data on the storage device for a long time. The storage device is used as main storage in various electronic devices, such as a computer, a smartphone, a smart pad, etc.

The nonvolatile memory of the storage device deteriorates over time due to various factors, and the storage device may cope with the deterioration in a way to vary an operating condition based on the degree of deterioration. For example, the storage device may cope with the deterioration in a way to adjust a level of a read voltage based on an operating condition of the storage device. In general, a level of the read voltage may be adjusted for each memory block. However, read voltages of memory regions of a memory block, which are connected to different word lines, may vary differently with deterioration. There is a demand for adjusting a read voltage more finely for the purpose of securing reliability associated with driving the storage device.

SUMMARY

Various example embodiments of the inventive concepts provide for a storage device including a nonvolatile memory device which may secure reliability in consideration of a change of an operation state due to deterioration of the nonvolatile memory device, a system including the storage device, and/or an operating method thereof.

According to at least one example embodiment, a storage device includes a nonvolatile memory device and a memory controller. The nonvolatile memory device includes at least one memory block, the at least one memory block including at least a first memory region connected to a first word line and a second memory region connected to a second word line. The memory controller is configured to set a read block voltage corresponding to the memory block based on a first read voltage to be applied to the first memory region, set variation information related to the first memory region, the second memory region, and the read block voltage based on a change of a read voltage of the first memory region and a change of a read voltage of the second memory region, and determine a second read voltage to be applied to the second memory region based on the variation information.

According to at least one example embodiment, an operating method of a storage device includes receiving, using a memory controller, a read request for a memory region connected to a target word line, searching, using the memory controller, for a read block voltage corresponding to a memory block included in the memory region, in response to the read request, set, using the memory controller, variation information based on prediction values of read voltages, the read voltages being respectively provided to a plurality of word lines of the memory region, and calculating, using the memory controller, a target read voltage to be provided to the target word line based on the read block voltage and the variation information.

According to at least one example embodiment, a storage device includes a nonvolatile memory that includes at least one memory block, and a memory controller configured to set a read block voltage for the at least one memory block based on a read voltage provided to a word line corresponding to a successful read operation and location information corresponding to the word line, and determine a target read voltage to be provided to a target word line connected with a read-requested memory region based on the read block voltage and location information of the target word line.

BRIEF DESCRIPTION OF THE FIGURES

The above and other objects and features of the inventive concepts will become apparent by describing in detail some example embodiments thereof with reference to the accompanying drawings.

DETAILED DESCRIPTION

Below, various example embodiments of the inventive concepts will be described clearly and in detail with reference to accompanying drawings to such an extent that an ordinary one in the art may implement example embodiments of the inventive concepts.

Figure 1:
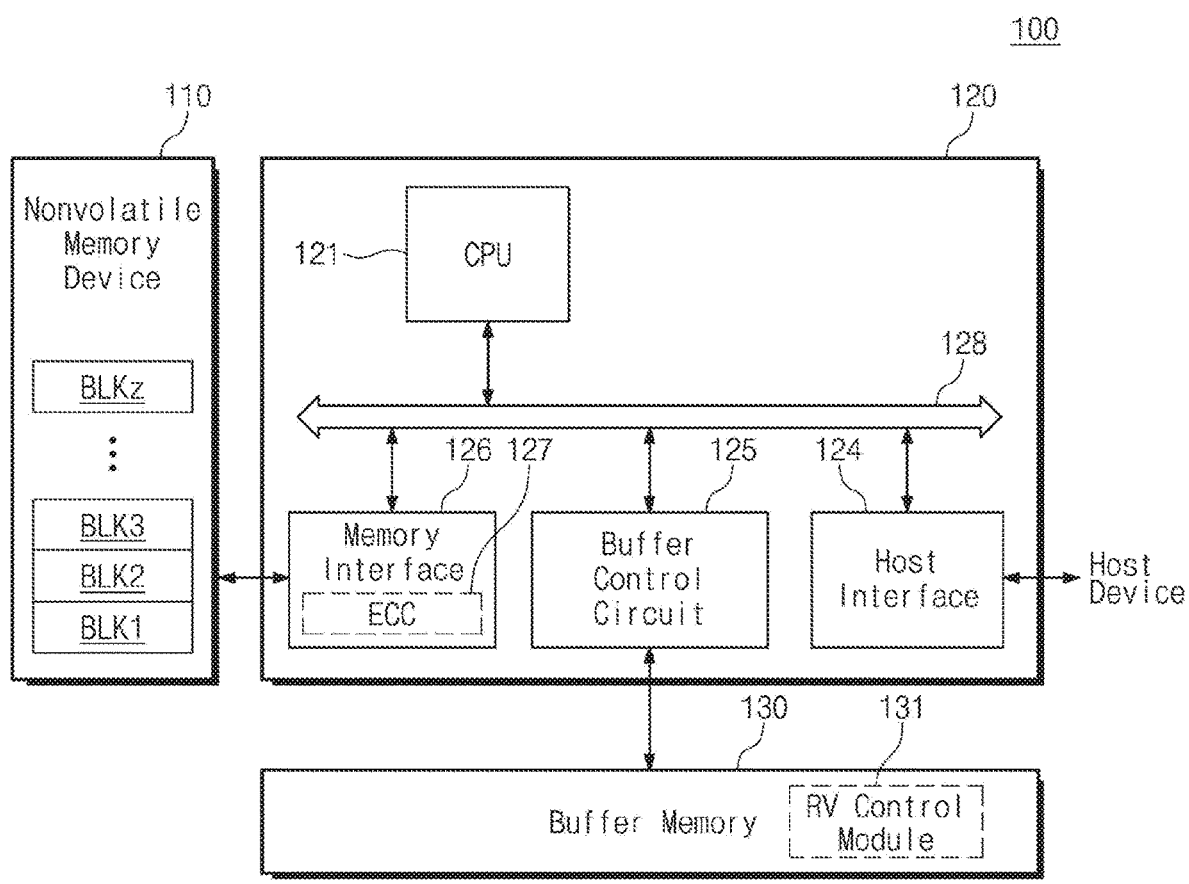
FIG. 1 is a block diagram illustrating a storage device according to at least one example embodiment of the inventive concepts.

FIG. 1 is a block diagram illustrating a storage device according to at least one example embodiment of the inventive concepts. Referring to FIG. 1, a storage device 100 includes a nonvolatile memory device 110, a memory controller 120, and/or a buffer memory 130, etc., but the example embodiments are not limited thereto. The storage device 100 may be implemented in the form of, but is not limited to, a solid state drive (SSD), a memory card, an embedded multimedia card (eMMC), and/or universal flash storage (UFS), etc.

The nonvolatile memory device 110 may perform a write operation, a read operation, an erase operation, etc., under the control of the memory controller 120. The nonvolatile memory device 110 may receive a write command, an address, and data, etc., from the memory controller 120, and in response to the write command, may write the data to a storage space identified by the address. The nonvolatile memory device 110 may receive a read command and an address, etc., from the memory controller 120, may read data from a storage space identified by the address, and may output the read data to the memory controller 120. The nonvolatile memory device 110 may receive an erase command and an address from the memory controller 120 and may erase data of a storage space identified by the address.

The nonvolatile memory device 110 may include a plurality of memory blocks BLK1 to BLKz, but is not limited thereto. Each of the memory blocks BLK1 to BLKz may include a plurality of memory cells, but is not limited thereto. The memory cells may form a storage space of the nonvolatile memory device 110. Each of the memory blocks BLK1 to BLKz may further include selection transistors that make it possible to select memory cells independently of each other, and/or may be selected in groups of memory cells, collectively. The memory blocks BLK1 to BLKz may be distinguished according to an operational characteristic and/or a structural characteristic of the nonvolatile memory device 110.

The nonvolatile memory device 110 may include a flash memory, a phase-change random access memory (PRAM), a ferroelectric RAM (FeRAM), a magnetic RAM (MRAM), a resistive RAM (RRAM), etc.

The memory controller 120 may access the nonvolatile memory device 110 and/or the buffer memory 130, etc. The memory controller 120 may perform a write operation, a read operation, an erase operation, and/or other commands, in response to a request of an external host device, a built-in self-test device, at least one internal/integrated processor, etc. The memory controller 120 may write write-requested data to the nonvolatile memory device 110 and may read read-requested data from the nonvolatile memory device 110.

The memory controller 120 may manage the storage device 100 by using the buffer memory 130. For example, the memory controller 120 may temporarily store data to be written to the nonvolatile memory device 110 and/or data read from the nonvolatile memory device 110 in the buffer memory 130. The memory controller 120 may load metadata desired and/or necessary to manage the nonvolatile memory device 110 onto the buffer memory 130.

The memory controller 120 may include at least one central processing unit (hereinafter referred to as "CPU") 121, a host interface 124, a buffer control circuit 125, a memory interface 126, and/or a bus 128, etc.

The CPU 121 may control overall operations of the memory controller 120 and may perform a logical operation. The CPU 121 may communicate with the external host device through the host interface 124, may communicate with the nonvolatile memory device 110 through the memory interface 126, and/or may communicate with the buffer memory 130 through the buffer control circuit 125, but is not limited thereto. The CPU 121 may control the storage device 100 by using the buffer memory 130, but is not limited thereto. The CPU 121 may execute a read voltage control module 131 loaded onto the buffer memory 130, however the example embodiments are not limited thereto and, for example, the read voltage control module 131 may be embodied as a separate circuit and/or processing device (e.g., an application specific integrated circuit (ASIC), a System on Chip (SoC), a field programmable gate array (FPGA), etc.), etc. In a read operation, as the read voltage control module 131 is executed, the memory controller 120 may determine a read voltage for the nonvolatile memory device 110. The CPU 121 may be implemented with a multi-core processor including a plurality of cores, as a multi-processor system, a distributed processing system, a cloud computing system, etc.

The host interface 124 is configured to communicate with the host device under control of the CPU 121. The host interface 124 may be configured to transmit and/or receive communications by using at least one of various communication types, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and/or a load reduced DIMM (LRDIMM), etc.

The buffer control circuit 125 is configured to control the buffer memory 130 under control of the CPU 121. The buffer control circuit 125 allows the buffer memory 130 to store and/or temporarily store data which the nonvolatile memory device 110 and the host device exchange.

The memory interface 126 is configured to communicate with the nonvolatile memory device 110 under the control of the CPU 121. The memory interface 126 may convey a command, an address, and/or data, etc., to the nonvolatile memory device 110 through an input/output channel. The memory interface 126 may convey a control signal to the nonvolatile memory device 110 through the control channel.

The memory interface 126 may include an error correction block 127 (e.g., an error correction circuit, etc.). The error correction block 127 may include an error correction code. The error correction block 127 may perform error correction. The error correction block 127 may perform error correction encoding based on data to be written to the nonvolatile memory device 110 through the memory interface 126. The error correction encoded data may be provided to the nonvolatile memory device 110 through the memory interface 126. The error correction block 127 may perform error correction decoding on data received through the memory interface 126 from the nonvolatile memory device 110.

The bus 128 provides a communication path between the components of the memory controller 120. The CPU 121, the host interface 124, the buffer control circuit 125, and/or the memory interface 126, etc., may exchange data with each other through the bus 128. The bus 128 may be configured to support various types of communication formats used in the memory controller 120.

The buffer memory 130 may store codes and/or computer readable instructions that the CPU 121 executes. The buffer memory 130 may store data processed by the CPU 121. The buffer memory 130 may include a random access memory (RAM). A flash translation layer FTL or various memory management modules may be stored in the buffer memory 130. The flash translation layer FTL may perform address mapping, garbage collection, wear leveling, etc., for the purpose of providing interfacing between the nonvolatile memory device 110 and the host device, but is not limited thereto.

The read voltage control module 131 may be stored in the buffer memory 130, but the example embodiments are not limited thereto. The read voltage control module 131 may be executed by the CPU 121, but is not limited thereto. As the read voltage control module 131 is executed by the CPU 121, the memory controller 120 may determine a read voltage so as to cope with (e.g., compensate for, etc.) a change of a read level due to various deteriorated conditions occurring at and/or effecting the nonvolatile memory device 110. As the read voltage control module 131 is executed, the memory controller 120 may set a read block voltage for each of the memory blocks BLK1 to BLKz, and may determine a read voltage of the nonvolatile memory device 110 based on the set read block voltage and variation information. The variation information may be a value which is obtained by predicting a change of a read voltage due to deterioration of the nonvolatile memory device 110. How the read voltage is determined will be more fully described later.

Figure 2:
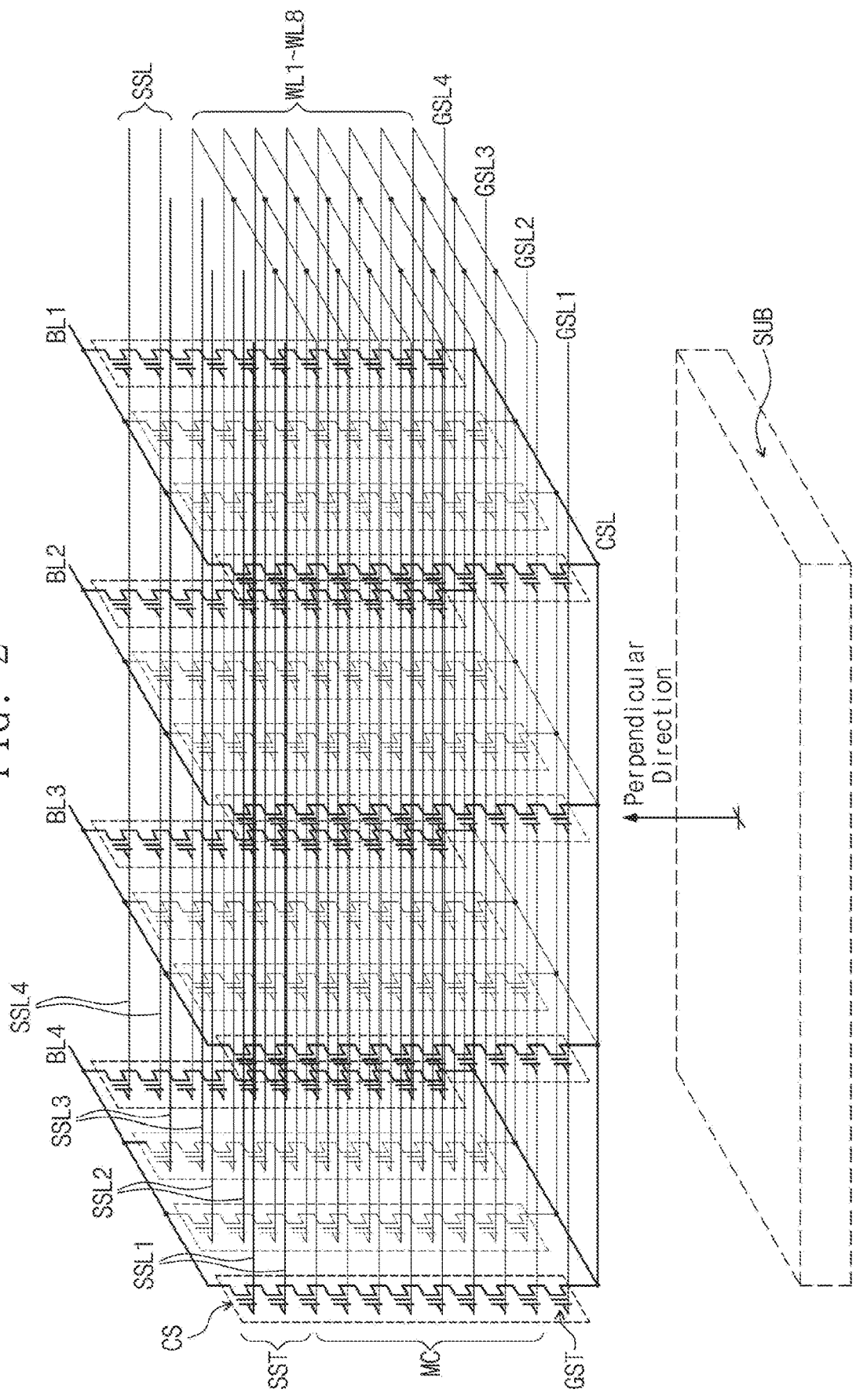
FIG. 2 is an example circuit diagram of a memory block of FIG. 1 according to at least one example embodiment.

FIG. 2 is an example circuit diagram of a memory block of FIG. 1 according to at least one example embodiment, however the example embodiments are not limited thereto. Referring to FIG. 2, a plurality of cell strings CS may be disposed on a substrate SUB in rows and columns. The plurality of cell strings CS may be connected in common to the common source line CSL formed on (or in) the substrate SUB. A location of the substrate SUB is illustrated as an example to help understand a structure of the memory block BLKa, but the example embodiments are not limited thereto. At least one example embodiment may include a common source line CSL connected to lower ends of the cell strings CS. However, it is sufficient that the common source line CSL is electrically connected to the lower ends of the cell strings CS, and the example embodiments are not limited to the case that the common source line CSL is physically located at the lower ends of the cell strings CS. At least one example embodiment may include cell strings CS arranged in a four-by-four matrix. However, the example embodiments are not limited thereto and the number of cell strings CS and corresponding circuitry in the memory block BLKa may increase or decrease.

Cell strings of each row may be connected to a corresponding one of first to fourth ground selection lines GSL1 to GSL4 and a corresponding one of first to fourth string selection lines SSL1 to SSL4. Cell strings of each column may be connected to a corresponding one of first to fourth bit lines BL1 to BL4. For ease of illustration, cell strings that are connected to the second and third ground selection lines GSL2 and GSL3 or the second and third string selection lines SSL2 and SSL3 are depicted to be blurry.

Each cell string CS may include at least one ground selection transistor GST connected to a corresponding ground selection line, a first dummy memory cell DMC1 connected to a first dummy word line DWL1, a plurality of memory cells MC respectively connected to a plurality of word lines WL1 to WL8, a second dummy memory cell DMC2 connected to a second dummy word line DWL2, and/or string selection transistors SST respectively connected to string selection lines SSL, but the example embodiments are not limited thereto. In each cell string CS, the ground selection transistor GST, the first dummy memory cell DMC1, the memory cells MC, the second dummy memory cell DMC2, and/or the string selection transistors SST may be serially connected to each other along a direction perpendicular to the substrate SUB and may be sequentially stacked along a direction perpendicular to the substrate SUB, but the example embodiments are not limited thereto.

In at least one example embodiment, one or more dummy memory cells may be arranged between the ground selection transistor GST and the memory cells MC in each cell string CS. In each cell string CS, one or more dummy memory cells may be arranged between the string selection transistors SST and the memory cells MC. In each cell string CS, one or more dummy memory cells may be arranged between the memory cells MC. The dummy memory cells may have the same structure as the memory cells MC and may not be programmed (e.g., program inhibited) or may be programmed differently from the memory cells MC. For example, when memory cells are programmed to form two or more threshold voltage distributions, the dummy memory cells may be programmed to have one threshold voltage distribution range or to have threshold voltage distributions of which the number is less than that of the memory cells MC. However, the example embodiments are not limited thereto.

Memory cells of the cell strings CS that are arranged at the same height from the substrate SUB or the ground selection transistor GST may be electrically connected in common. Memory cells of the cell strings CS that are arranged at different heights from the substrate SUB or the ground selection transistor GST may be electrically separated from each other. At least one example embodiment is established in FIG. 2 as memory cells of the same height are connected to the same word line. However, the example embodiments are not limited thereto and, for example, the memory cells of the same height may be directly connected to each other in a plane where the memory cells are formed or may be indirectly connected to each other through another layer such as a metal layer, etc.

Memory cells which correspond to a string (or ground) selection line and a word line may constitute a page. A write operation and a read operation may be performed by the page. In each page, each memory cell may store two or more bits. Bits that are written in memory cells belonging to one page may form logical pages. For example, k-th bits that are respectively written in memory cells of each page may form a k-th logical page, etc.

The memory block BLKa may be provided at a three-dimensional (3D) memory array, but the example embodiments are not limited thereto. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In at least one example embodiment of the inventive concepts, the 3D memory array includes vertical cell strings CS (or NAND strings) that are vertically oriented such that at least one memory cell is located over another memory cell. The at least one memory cell may comprise a charge trap layer. Each cell string may further include at least one selection transistor placed over the memory cells MC. The at least one selection transistor may have the same structure as the memory cells MC and may be formed monolithically with the memory cells MC.

Figure 3:
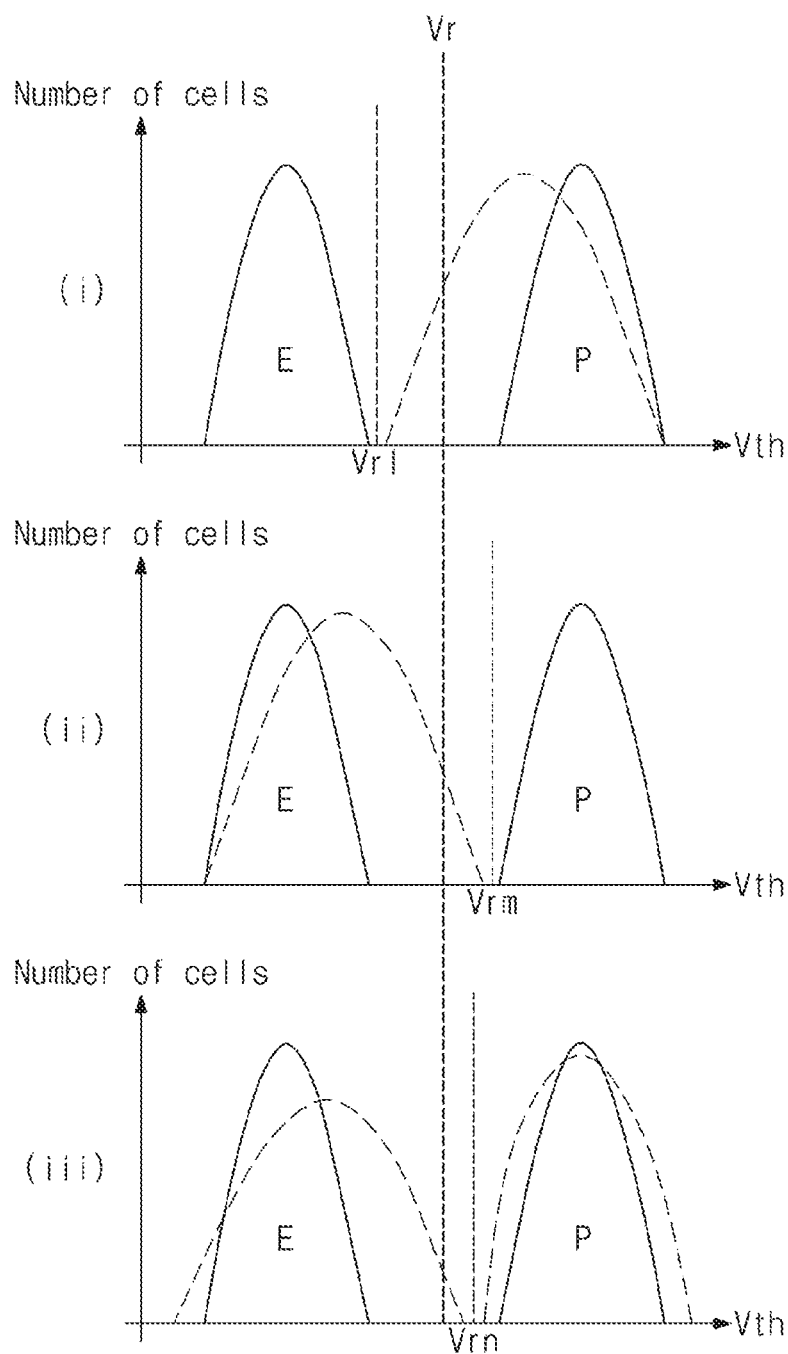
FIG. 3 is a graph for describing a change of a threshold voltage distribution of memory cells illustrated in FIG. 2 according to at least one example embodiment.

FIG. 3 is a graph for describing a change of a threshold voltage distribution of memory cells illustrated in FIG. 2 according to at least one example embodiment, but the example embodiments are not limited thereto. FIG. 3 is a diagram for describing examples in which a threshold voltage distribution varies with a particular deterioration factor. Referring to FIG. 3, a horizontal axis represents a threshold voltage Vth of a memory cell, and a vertical axis represents the number of memory cells. For the convenience of description, it is assumed that a memory cell is a single level cell (SLC), but the example embodiments are not limited thereto. The single level cell has an erase state "E" or a program state "P" depending on a desired threshold voltage of the single level cell. For the convenience of description, FIG. 3 will be described with reference to reference marks/numerals of FIG. 1.

Referring to (i) to (iii) of FIG. 3, a solid line indicates an initial state of a threshold voltage distribution. The erase state "E" and the program state "P" may be identified by using an initial read voltage Vr. In an initial state, a read margin enough to identify the erase state "E" and the program state "P" may be present between the erase state "E" and the program state "P".

A dotted line indicates an example in which a desired threshold voltage distribution changes due to the deterioration and/or defects of the nonvolatile memory device while using the storage device 100. For example, a defect may occur at a memory cell while fabricating the storage device 100 and/or through the use of the storage device 100. A defect may occur due to the deterioration of the nonvolatile memory device 110 while using the storage device 100 (e.g., voltage and/or current leakage, etc., exhibited by one or more memory cells of the storage device 100, etc.), and the deterioration may cause a change of a desired threshold voltage distribution of memory cells.

Referring to graph (i) of FIG. 3, a threshold voltage distribution (e.g., a desired threshold voltage distribution, etc.) may change in a direction in which the threshold voltages corresponding to the program state "P" decrease, but is not limited thereto. For example, if an operating temperature of the nonvolatile memory device 110 increases, trapped electrical charges of a memory cell may be leaked out, and thus, a threshold voltage of the memory cell having the program state "P" may decrease. As a result, it is difficult to identify the erase state "E" and the program state "P" by using the initial read voltage Vr. Accordingly, the initial read voltage Vr may be adjusted to a first read voltage Vrl. An operating temperature of the nonvolatile memory device 110 may be a deterioration factor for causing a change of a threshold voltage and/or deterioration of the memory device 110.

Referring to graph (ii) of FIG. 3, a threshold voltage distribution may change in a direction in which threshold voltages corresponding to the erase state "E" increase, but is not limited thereto. For example, if the number of times that a memory cell is read increases, a charge trap phenomenon may occur at a memory cell of the erase state "E" due to a read disturb phenomena, and thus, a threshold voltage of a memory cell having the erase state "E" may increase. As another example, if the number of times that a memory cell is written increases, a tunnel oxide of the memory cell may deteriorate, and thus, a threshold voltage of a memory cell having the erase state "E" may increase. As a result, it is difficult to identify the erase state "E" and the program state "P" by using the initial read voltage Vr. Accordingly, the initial read voltage Vr may be adjusted to a second read voltage Vrm. With regard to the nonvolatile memory device 110, the number of times that a read operation is performed (hereinafter referred to as a "read count") and the number of times that a write operation is performed (hereinafter referred to as a "write count") may be a deterioration factor causing deterioration of the memory cells and a change of a threshold voltage of the memory cells.

Referring to graph (iii) of FIG. 3, threshold voltage distributions of the erase state "E" and/or the program state "P" may change in a direction in which the threshold voltage distributions widen, but the example embodiments are not limited thereto. For example, in the case where the number of program/erase cycles of the nonvolatile memory device 110 increases and/or in the case where a retention time increases, electrical charges trapped in memory cells may be leaked out, thereby causing a change of a threshold voltage distribution. As a result, it is difficult to identify the erase state "E" and the program state "P" by using the initial read voltage Vr. Accordingly, the initial read voltage Vr may be adjusted to a third read voltage Vrn, etc. With regard to the nonvolatile memory device 110, the number of program/erase cycles and/or the retention time may be a deterioration factor causing deterioration and/or a change of a threshold voltage of the nonvolatile memory device 110.

The storage device 100 according to at least one example embodiment of the inventive concepts may generate variation information based on a result of predicting a change of a read voltage due to one or more deterioration factors, such as the above-described deterioration factors, etc., and may determine a read voltage of a memory region targeted for a read operation based on the variation information. The variation information may be determined by evaluating the nonvolatile memory device 110 for each of operating conditions associated with one or more deterioration factors (e.g., such as the above-described deterioration factors, etc.). The variation information will be more fully detailed later.

Figure 4:
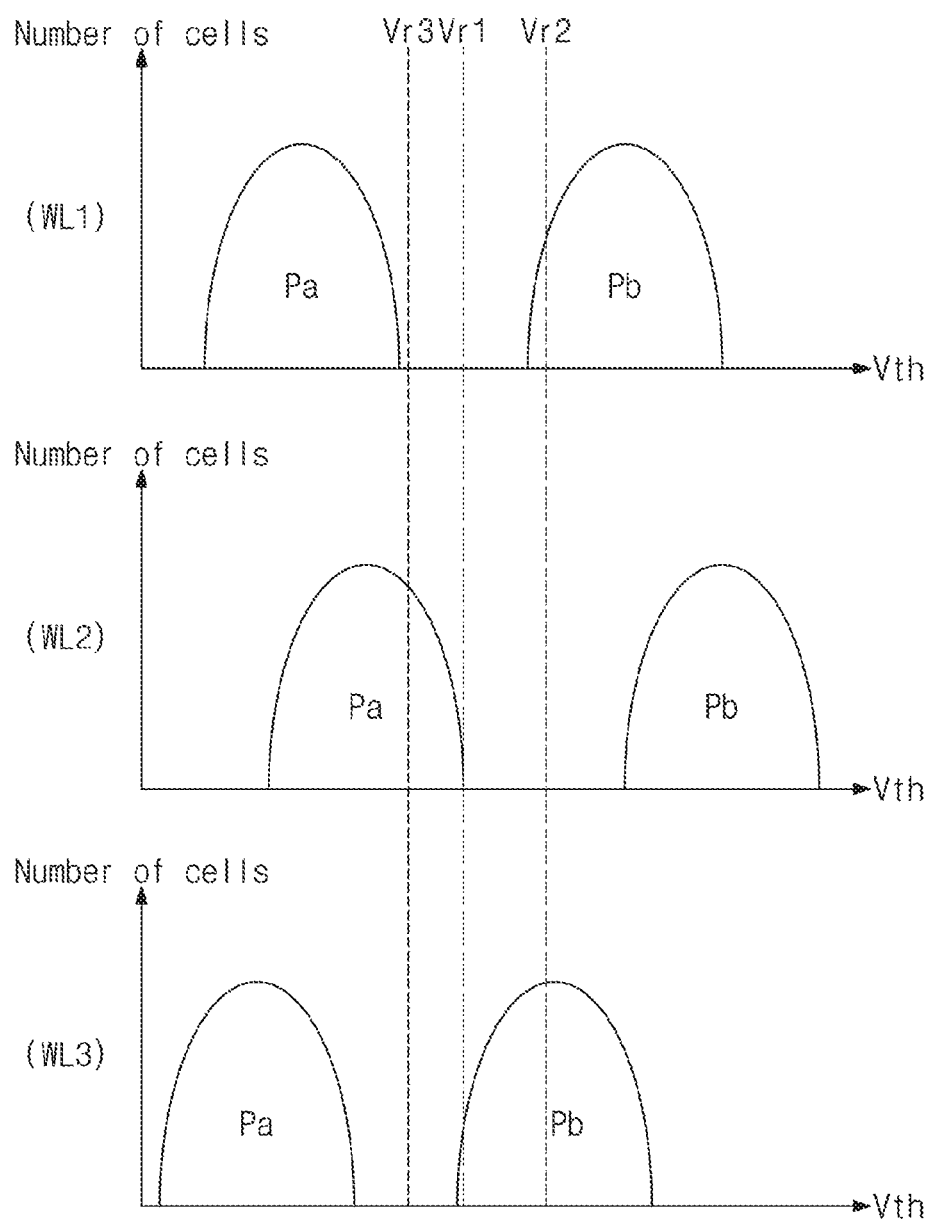
FIG. 4 is a graph for describing a change of a threshold voltage distribution for each word line of the memory cells illustrated in FIG. 2 according to at least one example embodiment.

FIG. 4 is a graph for describing a change of a threshold voltage distribution for each word line of memory cells illustrated in FIG. 2 according to at least one example embodiment. FIG. 4 is a diagram for describing examples in which a threshold voltage distribution varies with a particular deterioration factor for each word line. Referring to FIG. 4, a horizontal axis represents a threshold voltage Vth of a memory cell, and a vertical axis represents the number of memory cells. A memory cell may be a multi-level cell (MLC); for the convenience of description, only threshold voltage distributions corresponding to two program states Pa and Pb are illustrated, however the example embodiments are not limited thereto. The multi-level cell may have the first program state Pa or the second program state Pb depending on a threshold voltage of the multi-level cell. For convenience's sake, FIG. 4 will be described with reference to reference numerals/marks of FIG. 1.

Referring to graphs of FIG. 4, a threshold voltage distribution of memory cells connected to a first word line WL1, a threshold voltage distribution of memory cells connected to a second word line WL2, and a threshold voltage distribution of memory cells connected to a third word line WL3 are illustrated, but the example embodiments are not limited thereto. With regard to the memory cells connected to the first word line WL1, the first program state Pa and the second program state Pb may be identified by using a first read voltage Vr1. With regard to the memory cells connected to the second word line WL2, the first program state Pa and the second program state Pb may be identified by using a second read voltage Vr2. With regard to the memory cells connected to the third word line WL3, the first program state Pa and the second program state Pb may be identified by using a third read voltage Vr3.

Even though memory cells are included in the same memory block, threshold voltage distributions of the memory cells may be different from each other. For example, threshold voltage distributions respectively corresponding to the first to third word lines WL1 to WL3 may be different from each other. In this case, an improved and/or optimal read voltage for identifying the first program state Pa and the second program state Pb may vary for each word line. That is, the first to third read voltages Vr1 to Vr3 may be different from each other. In the case where the same read voltage is provided to memory cells included in the nonvolatile memory device 110, it may be more difficult and/or impossible to identify the first program state Pa or the second program state Pb with regard to a memory cell.

For example, threshold voltage distributions of memory cells may vary with and/or based on the locations of the memory cells. For example, referring to FIG. 2, considering a width of a pillar, a cross section which is parallel to an upper surface of the substrate SUB may become smaller as a distance from the substrate SUB decreases. Accordingly, when a voltage is applied to a memory cell adjacent to the substrate SUB through a word line, an electric field formed at the memory cell adjacent to the substrate SUB may be greater than an electric field formed at a memory cell far from the substrate SUB. This may have an influence on the read disturb and may cause different deterioration states for respective word lines.

Besides, the degree of deterioration due to various deterioration factors, such as a retention time, the number of program/erase cycles, and/or a temperature may vary with a location of a memory cell, etc. Since a distance from a substrate, a width of an adjacent pillar, etc. are almost uniform with regard to memory cells connected to the same word line, the memory cells may have similar or the same deterioration states. Also, since lengths of word lines are uniform or substantially uniform, memory regions connected to different word lines may have a given correlation depending on the deterioration state.

The storage device 100 according to at least one example embodiment of the inventive concepts may generate variation information based on a result of predicting a difference between read voltages of word lines, and may determine a read voltage of a memory region targeted for a read operation based on the variation information. The variation information may be determined by evaluating a change of a read voltage associated with various deterioration factors for each word line. The variation information will be more fully detailed later.

Figure 5:
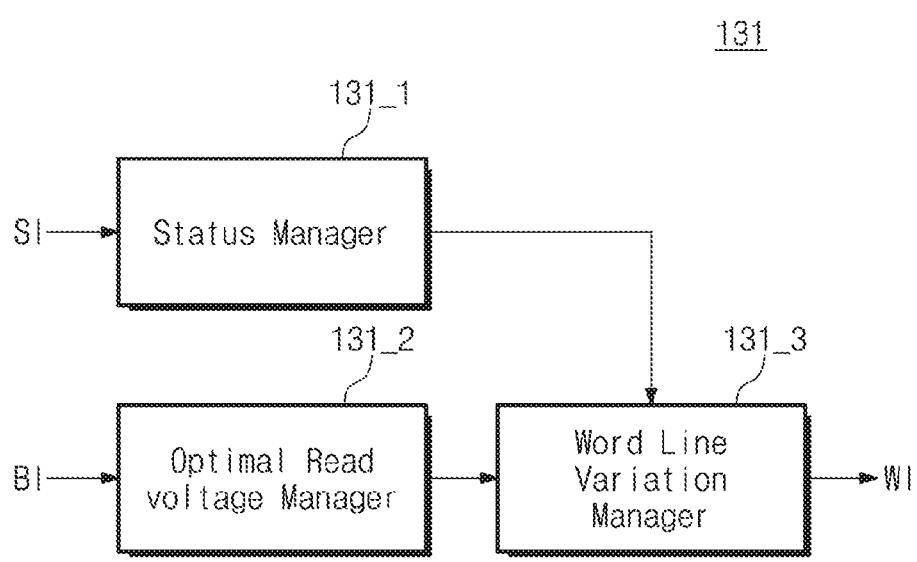
FIG. 5 is a block diagram illustrating a read voltage control module of FIG. 1 according to at least one example embodiment.

FIG. 5 is a block diagram illustrating a read voltage control module of FIG. 1 according to at least one example embodiment. Referring to FIG. 5, the read voltage control module 131 includes a status manager 131_1, an optimal read voltage manager 131_2, and/or a word line variation manager 131_3, but the example embodiments are not limited thereto. The read voltage control module 131 may be loaded and executed on the buffer memory 130 under the control of the CPU 121, but the example embodiments are not limited thereto, and for example, the read voltage control module 131 may be embodied as a separate circuit and/or processing device (e.g., application specific integrated circuit (ASIC), System on Chip (SoC), field programmable gate array (FPGA), etc.), etc. For example, in the case where the read voltage control module 131 is implemented by firmware, the read voltage control module 131 may be stored in the nonvolatile memory device 110. In this case, the read voltage control module 131 may be loaded onto the buffer memory 130 and may be executed by the CPU 121. Additionally, the read voltage control module 131 may be implemented with hardware such as an application specific integrated circuit (ASIC) or a field programmable gate array (FPGA). For the convenience of description, FIG. 5 will be described with reference to reference marks/numerals of FIG. 1.

The status manager 131_1 may predict and/or manage prediction values of read voltages to be respectively provided to a plurality of word lines, and the prediction values may be determined according to deterioration (e.g., a deterioration condition and/or deterioration state, etc.) of at least one memory block. The status manager 131_1 may receive status information SI from the buffer memory 130. The status information SI may include pieces of status information about a plurality of memory regions included in a memory block. Here, each of the plurality of memory regions may include memory cells connected with the same word line, but is not limited thereto.

The status information SI may include information about an aging state of the nonvolatile memory device 110. Also, the status information SI may further include information about a result of evaluating a change of a read voltage due to deterioration of the nonvolatile memory device 110. The evaluation may be performed in advance (and/or in real-time), and evaluation associated with a change of a read voltage according to a condition of various deterioration factors such as a program/erase count, a retention time, and read disturb may be performed in advance and/or in real-time for each memory region. For example, the memory controller 120 may not separately manage the information about the aging state and/or the information about a result of evaluating a change of a read voltage in advance. In this case, the memory controller 120 may store only variation information which is generated based on the status information SI.

For example, the status information SI may include information about states of the memory regions which are based on a current deterioration state. In at least one example embodiment, the memory controller 120 may store and update a program/erase count for each memory block of the nonvolatile memory device 110, a read count for each memory region, a temperature, a retention time, etc., which are managed for wear leveling. Information of a current deterioration state may be used to calculate a read voltage for a memory region to be read later.

The optimal read voltage manager 131_2 may set a desired read block voltage for each memory block. In the case where a read request for a memory region included in a particular memory block is received, the read block voltage may indicate a voltage level to be referenced to calculate a read voltage for the corresponding memory region. The same read block voltage may be used within the same memory block.

The optimal read voltage manager 131_2 may search for an improved and/or optimal read voltage for the purpose of generating the read block voltage. Here, the improved and/or optimal read voltage may be a set of read voltages which may make all program states identifiable without occurrence of an error upon performing a read operation on a particular memory region. For example, the improved and/or optimal read voltage may be a set of read voltages, at which a read operation previously requested with regard to a particular memory block succeeds. The optimal read voltage manager 131_2 may generate and store the read block voltage based on the found improved and/or optimal read voltage. Example embodiments associated with generating the read block voltage will be more fully described later.

After the read block voltage is set, the storage device 100 may receive a read request from a host device. In this case, the optimal read voltage manager 131_2 may receive block information BI being information about a memory block corresponding to the read request. The optimal read voltage manager 131_2 may output the read block voltage of the memory block corresponding to the read request to the word line variation manager 131_3, based on the block information BI.

The word line variation manager 131_3 may generate and store variation information, based on prediction values (e.g., predicted values) of a read voltage, which are stored in the status manager 131_1 and correspond respectively to memory regions. The word line variation manager 131_3 may extract a correlation between memory regions according to deterioration (e.g., a deterioration state and/or condition of the memory cells/memory regions, etc.), and may generate variation information based on the extracted correlation. The variation information may be implemented with a table, an expression of relation (e.g., a desired relationship, etc.), a decision tree, and/or a weight of an artificial neural network, etc.

The word line variation manager 131_3 may determine a read voltage of a memory region corresponding to a read request based on the set variation information. The word line variation manager 131_3 may calculate a read voltage by applying, to the variation information, the read block voltage provided from the optimal read voltage manager 131_2. To calculate a read voltage, location information of a word line corresponding to the read-requested memory region and location information of a word line used to generate the read block voltage may be used.

For example, the word line variation manager 131_3 may calculate, through the variation information, a correlation between a word line corresponding to the read block voltage and a word line targeted for a read operation. A correction value of the read block voltage may be calculated based on the correlation. The word line variation manager 131_3 may calculate a final read voltage by applying the correction value to the read block voltage. For example, in the case where the status manager 131_1 generates information about a current deterioration state, the word line variation manager 131_3 may calculate a read voltage additionally in consideration of the information thus generated. To provide the calculated read voltage to a relevant word line of the nonvolatile memory device 110, the word line variation manager 131_3 may provide word line voltage information WI to the nonvolatile memory device 110.

Figure 6:
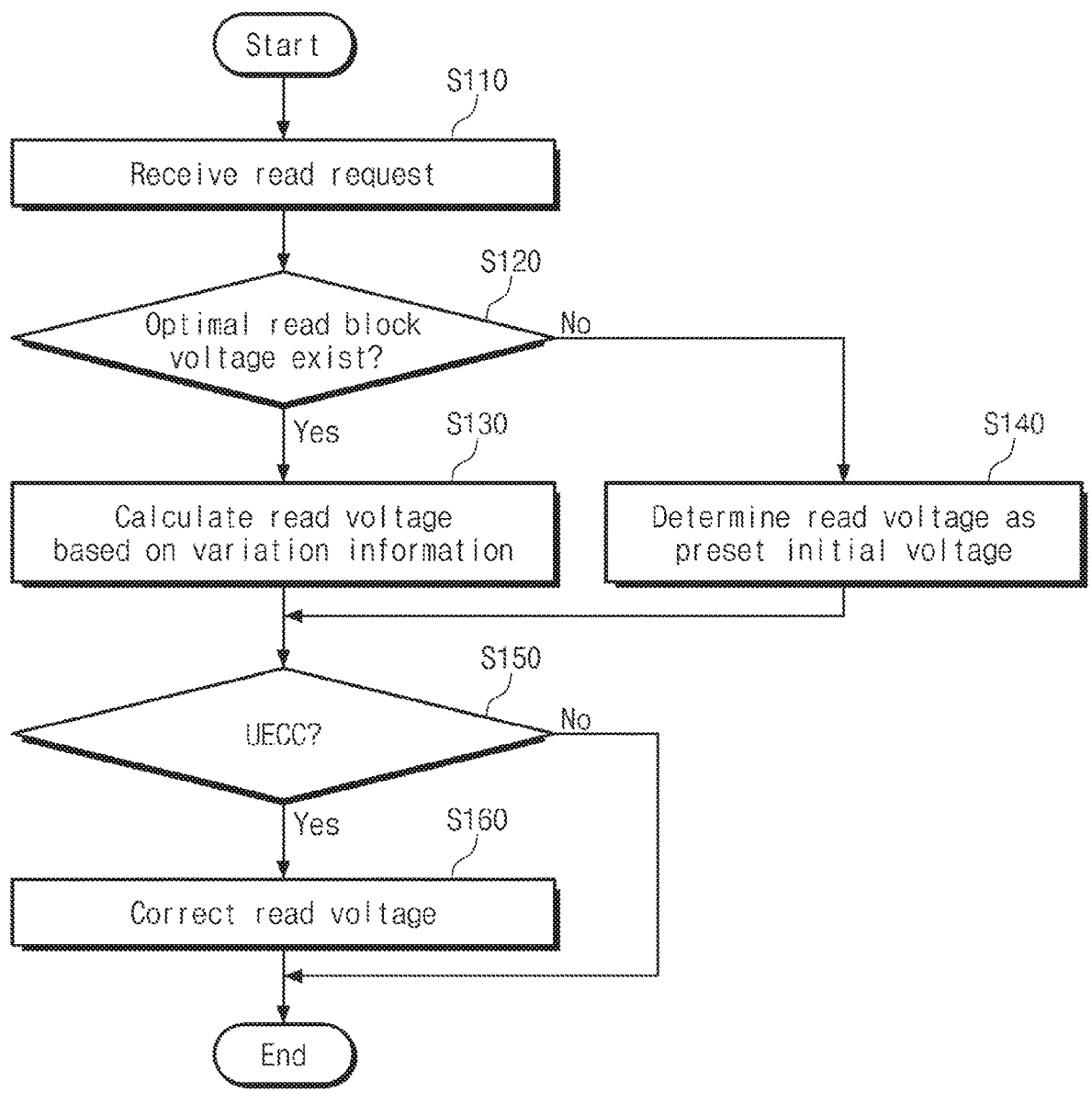
FIG. 6 is a flowchart illustrating a data read method of a storage device according to at least one example embodiment of the inventive concepts.

FIG. 6 is a flowchart illustrating a data read method of a storage device according to at least one example embodiment of the inventive concepts. Referring to FIG. 6, the data read method may be performed at the memory controller 120 of FIG. 1, but the example embodiments are not limited thereto. For the convenience of description, FIG. 6 will be described with reference to reference marks/numerals of FIG. 1.

In operation S110, the memory controller 120 may receive a read request from an external host device. The read request may be received through the host interface 124.

In operation S120, the memory controller 120 may determine a memory block of the nonvolatile memory device 110, in which the read-requested data are stored. The memory controller 120 may search whether a desired and/or optimal read block voltage corresponding to the relevant memory block exists. For example, a desired and/or optimal read block voltage may be set based on a read voltage provided to a word line where a read operation succeeds, before receiving the read request. In the case where the read block voltage exists, the process proceeds to operation S130; in the case where the read block voltage does not exist, the process proceeds to operation S140.

In operation S130, the memory controller 120 may calculate a read voltage corresponding to a read-requested memory region based on the read block voltage and/or variation information. The variation information may be generated based on a variation in a read voltage due to deterioration (e.g., a deterioration state and/or condition, etc.), for each memory region. The memory controller 120 may calculate the read voltage by applying the variation in the read voltage due to deterioration of a relevant memory region to the read block voltage.

In the case where the read block voltage does not exist, in operation S140, the memory controller 120 may determine the read voltage as a desired and/or preset initial voltage. Here, the initial voltage may be a default value selected by a user, etc.

In operation S150, the memory controller 120 may perform a read operation based on the read voltage determined in operation S130 or operation S140. The memory controller 120 may provide a read command and an address to the nonvolatile memory device 110 for the purpose of reading read-requested data. The nonvolatile memory device 110 may sense data from a memory cell in response to the read command and the address. The sensed data may be output to the memory controller 120.

In operation S150, the memory controller 120 may determine whether the performed read operation succeeds. For example, the memory controller 120 may determine whether an uncorrectable error correction code (UECC) was generated, by detecting and correcting an error of the data read based on the determined read voltage using an error correction technique. The UECC may indicate a state in which an error not corrected by the error correction block 127 of the memory controller 120 is included in the read data. The error correction block 127 may detect the UECC while performing error correction decoding on the data received from the nonvolatile memory device 110. In the case where the UECC is detected, the process proceeds to operation S160. In the case where the UECC is not detected, the read operation is determined as being successful, and thus, the read operation is terminated.

Since it is determined based on the detection of the UECC that the read operation does not succeed, in operation S160, the memory controller 120 corrects the read voltage in any other method. For example, the memory controller 120 may receive information about a current deterioration state of the nonvolatile memory device 110 and may correct a read voltage based on the current deterioration state. For example, the memory controller 120 may execute a prediction model created by performing machine learning on a change of a read voltage according to a deterioration state and may predict a read voltage based on the created prediction model, but the example embodiments are not limited thereto. The memory controller 120 may correct a read voltage set in advance (e.g., a previously set read voltage) by using the predicted read voltage. A way to correct a read voltage is not limited thereto, and various ways such as a decision tree, an artificial neural network, correcting the read voltage based on experiential data, etc., may be used to correct a read voltage. The corrected read voltage may be managed by the memory controller 120 and may be stored to the buffer memory 130. The memory controller 120 may update the read block voltage based on the corrected read voltage.

Figure 7:
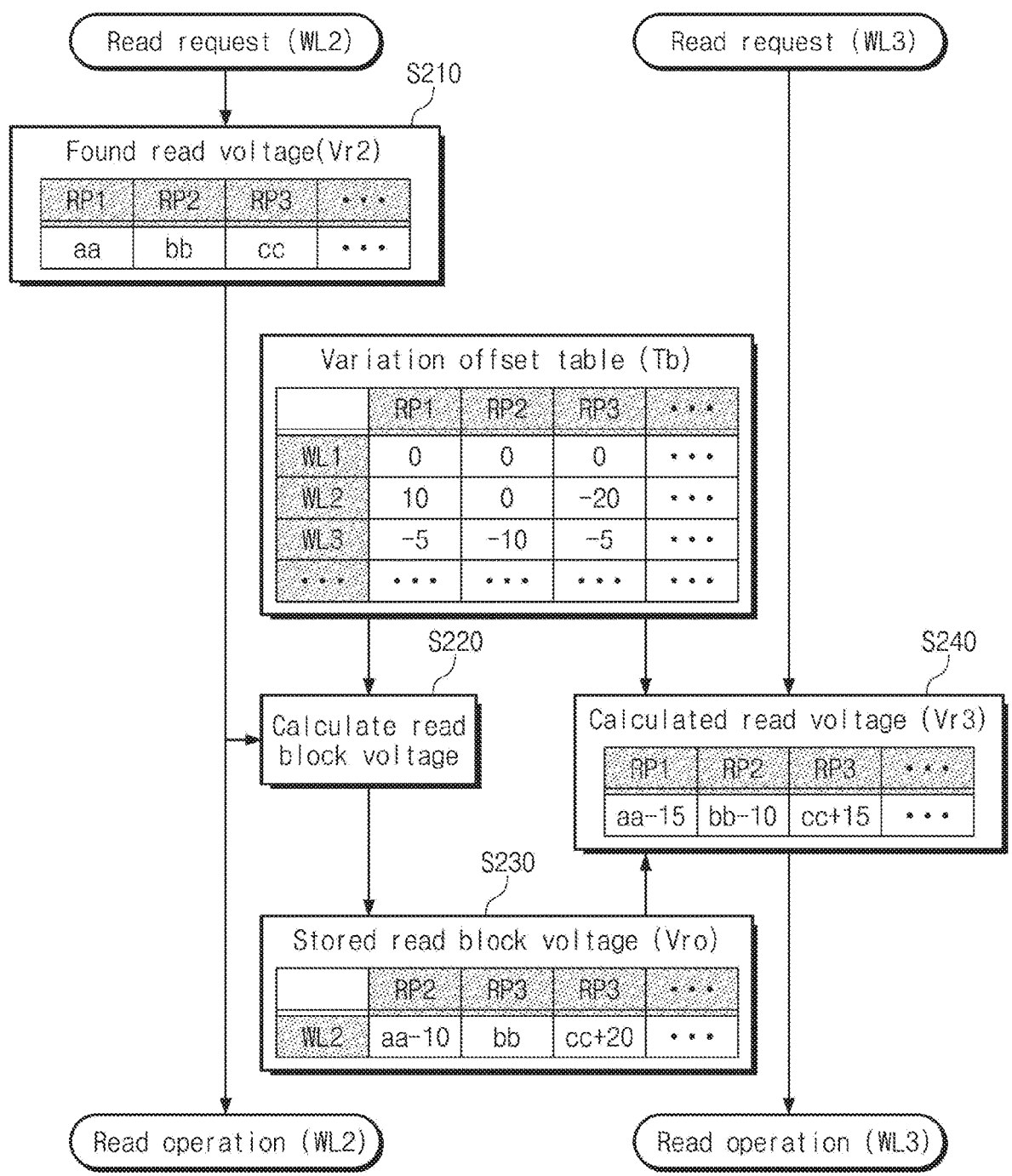
FIG. 7 is a flowchart illustrating at least one example embodiment of a data read method of FIG. 6.

FIG. 7 is a flowchart illustrating at least one example embodiment of a data read method of FIG. 6. Referring to FIG. 7, the data read method may be performed at the memory controller 120 of FIG. 1, but is not limited thereto. It is assumed that a memory cell included in the nonvolatile memory device 110 of FIG. 1 is a multi-level cell, but is not limited thereto. A memory cell may have one of a plurality of program states, and each of the plurality of program states may be identified by using the first to third read voltages RP1 to RP3, etc. For the convenience of description, FIG. 7 will be described with reference to reference marks/numerals of FIG. 1.

In operation S210, a read operation may be performed on a memory region connected to the second word line WL2. It is assumed that the read operation performed on the memory region connected to the second word line WL2 is successful. It is assumed that the read voltage Vr2 corresponding to the memory region connected to the second word line WL2 is (aa, bb, cc).

In operation S220, the memory controller 120 may calculate a read block voltage Vro for a memory block to which the second word line WL2 and the third word line WL3 belong (e.g., the memory controller 120 may calculate a read block voltage Vro for a memory block that is connected to the second word line WL2 and the third word line WL3). Operation S220 may be performed after the read operation is performed on the memory region connected to the second word line WL2. The read block voltage may be set based on a read voltage provided to a memory region where a read operation succeeds. In other words, a new read block voltage may be set based on a read voltage used for a successful read operation.

The read block voltage Vro may be generated based on variation information. In FIG. 7, the variation information may be managed in the form of a variation offset table Tb, but is not limited thereto. The variation offset table Tb may be created based on prediction values of read voltages according to deterioration (e.g., the deterioration state and/or deterioration condition, etc.) of a memory block, and the read voltages may be respectively provided to the word lines corresponding to the memory block. The prediction values may be evaluated in advance (and/or in real-time), and may be generated by applying a condition of various deterioration factors, such as a program/erase count and a retention time, to the nonvolatile memory device 110.

The variation offset table Tb may be created based on differences between a prediction value of a reference word line and prediction values of the remaining word lines. For example, assuming that the reference word line is the first word line WL1, table values (e.g., first offset information) corresponding to the first word line WL1 may be set to "0". Table values (e.g., second offset information) corresponding to the second word line WL2 may be the relative differences between the prediction values corresponding to the first word line WL1 and prediction values corresponding to the second word line WL2. Table values (e.g., third offset information) corresponding to the third word line WL3 may be relative differences between the prediction values corresponding to the first word line WL1 and prediction values corresponding to the third word line WL3, etc. That is, the variation offset table Tb may indicate a relative relationship of read voltages for respective word lines according to a particular deterioration condition (e.g., a range of a specified program/erase count).

Returning to operation S220, the read block voltage Vro may be calculated based on the variation offset table Tb. The read block voltage Vro may be calculated by applying the second offset information (e.g., 10, 0, −20) to the values (e.g., aa, bb, cc) of the read voltage Vr2 associated with the successful read operation. The read block voltage Vro of (e.g., aa−10, bb, cc+20) may be calculated by subtracting (e.g., 10, 0, −20) from (e.g., aa, bb, cc).

In operation S230, the memory controller 120 may manage and store the calculated read block voltage Vro. The read block voltage Vro may be stored to the buffer memory 130. For example, the memory controller 120 may manage location information of a word line used to generate the read block voltage Vro together with the calculated read block voltage Vro, but the example embodiments of the inventive concepts are not limited thereto. In the at least one example embodiment of FIG. 7, since the offset values of the variation offset table Tb are already applied to the stored read block voltage Vro, location information of a word line may not be separately managed, but the example embodiments are not limited thereto.

In operation S240, the memory controller 120 may calculate a read voltage for any other memory region based on the set read block voltage Vro and the variation offset table Tb. It is assumed that a read operation is performed on a memory region connected with the third word line WL3 after a read operation is performed on a memory region connected with the second word line WL2. Depending on a read request for the memory region connected with the third word line WL3, the memory controller 120 may determine whether the read block voltage Vro exists.

In FIG. 7, since the read block voltage Vro exists, the memory controller 120 may calculate a read voltage by applying the third offset information (e.g., −5, −10, −5) included in the variation offset table Tb to the read block voltage Vro. The read voltage Vr3 (e.g., aa−15, bb, cc+15) may be calculated by adding (e.g., aa−10, bb, cc+20) and (e.g., −5, −10, −5). The memory controller 120 may perform a read operation on the memory region connected to the third word line WL3, based on the calculated read voltage Vr3.

It may be possible to cope with a change of a read voltage due to deterioration not just for each memory block, but also for each word line by using the read block voltage Vro and the variation offset table Tb. Also, a resource for controlling a read voltage may decrease as a relative change of a read voltage according to deterioration for each word line is managed in the variation offset table Tb by using an offset value. Also, when the read block voltage Vro is set based on the variation offset table Tb, in a later and/or subsequent read operation, a read voltage may be determined through a simple addition operation. That is, an operation speed for determining a read voltage may be improved.

An example is illustrated in FIG. 7 as a read voltage is determined by using one variation offset table Tb, but according to at least one example embodiment, a plurality of variation offset tables may be provided to determine a read voltage. The plurality of variation offset tables may respectively correspond to conditions classified with respect to at least one of various deterioration factors, such as a retention time, a temperature of the memory device, a program/erase count, a read count, and/or read disturb, etc. In the case of using a plurality of variation offset tables, a variation offset table to be used may be selected based on at least one deterioration condition, and thus, accuracy of a read voltage may increase.

Figure 8:
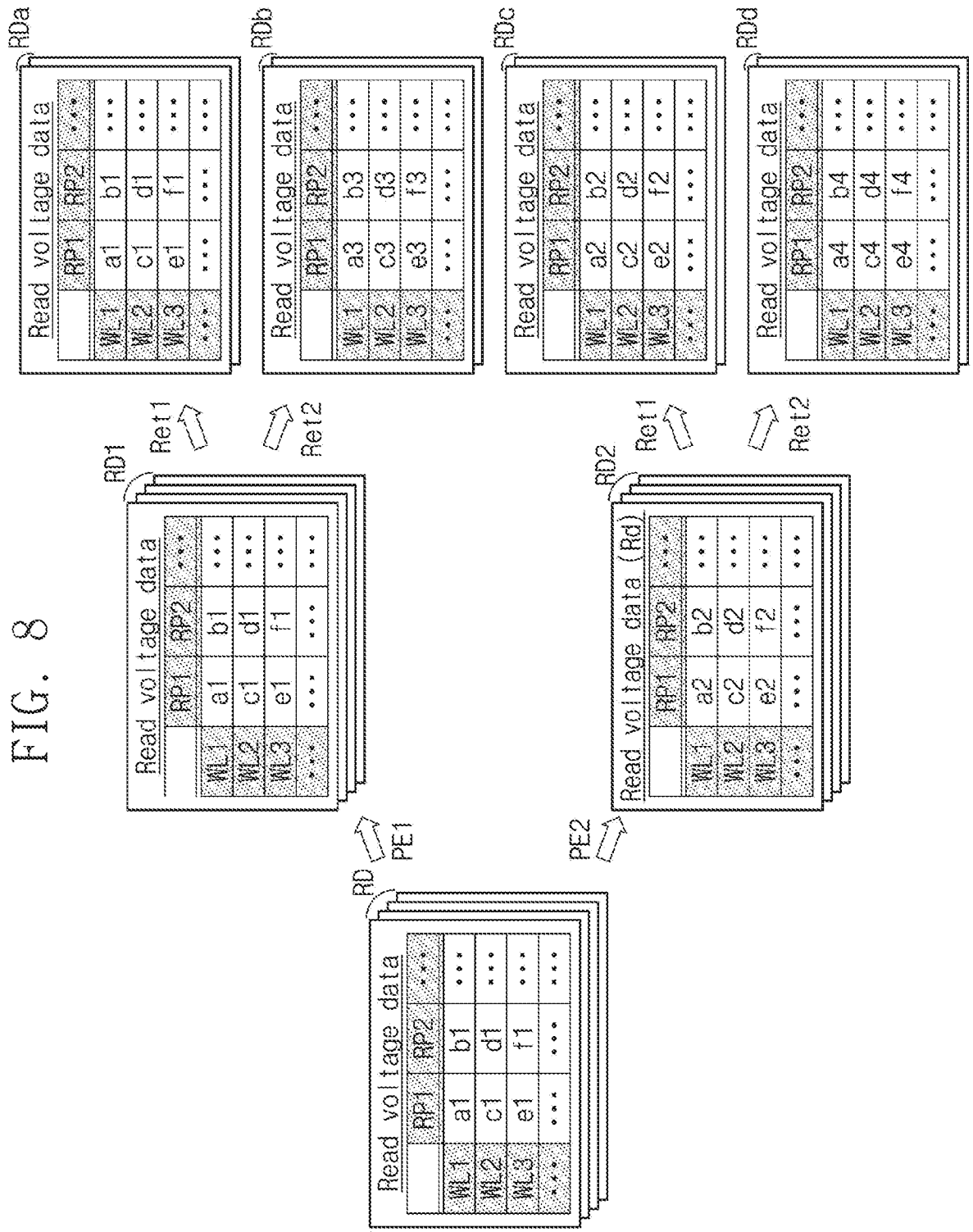
FIG. 8 is a diagram for describing a process of classifying tables when variation information includes a plurality of tables according to at least one example embodiment.

FIG. 8 is a diagram for describing a process of classifying tables when variation information includes a plurality of tables according to at least one example embodiment. For example, each of a plurality of variation offset tables may be the variation offset table Tb of FIG. 7. However, the example embodiments of the inventive concepts are not limited thereto. For example, each of the plurality of tables may be associated with a value of a read voltage predicted according to deterioration (e.g., a deterioration condition and/or deterioration state, etc.), not a relative offset value for each word line. The process of classifying tables may be performed at the storage device 100, but the example embodiments of the inventive concepts are not limited thereto. For example, tables may be classified through a separate test device, etc. In this case, results of the classification may be set to the memory controller 120 of the storage device 100, and may be utilized in a read operation of the storage device 100, etc.

Referring to FIG. 8, a read voltage of the nonvolatile memory device 110 according to deterioration is evaluated in advance, but is not limited thereto. The read voltage of the nonvolatile memory device 110 may be evaluated for each of a various number of deterioration factors. The deterioration factors may include, for example, at least one of a program/erase count, a read count, a retention time, a temperature, and/or read disturb, etc. Read voltage data RD classified according to a deterioration condition may be generated as a result of the evaluation. The read voltage data RD may be divided into a plurality of read voltages RP1, RP2, . . . , etc. depending on program states to be identified, and may be divided into memory regions corresponding to a plurality of word lines WL1, WL2, WL3, . . . , etc.

The read voltage data RD may be classified into a plurality of groups depending on a condition of a deterioration factor. First, the read voltage data RD may be classified into a first read voltage data group RD1 and a second read voltage data group RD2 depending on a condition of a first deterioration factor, etc. The number of data groups is for example purposes only, and it may be understood that the number of data groups is different from "2". In at least one example embodiment, the first deterioration factor may be a program/erase count, but is not limited thereto. The read voltage data RD in which the program/erase count is a first condition PE1 may be included in the first read voltage data group RD1, and the read voltage data RD in which the program/erase count is a second condition PE2 may be included in the second read voltage data group RD2, but is not limited thereto.

For example, the first condition PE1 of the program/erase count may be a program/erase count smaller than a reference count, and the first read voltage data group RD1 may include the read voltage data RD evaluated under the first condition PE1. The second condition PE2 of the program/erase count may be a program/erase count of not smaller than (e.g., greater than or equal to) the reference count, and the second read voltage data group RD2 may include the read voltage data RD evaluated under the second condition PE2. The reference count may be randomly set and/or set as desired by the designer. Additionally, an improved and/or optimized reference count may be generated by applying clustering to the read voltage data RD. In at least one example embodiment, the clustering may be performed through machine learning; in the case where a lot of data exist, a dimension reduction process for reducing the amount of data may be performed.

The first and second read voltage data groups RD1 and RD2 may be classified into first to fourth read voltage sub data groups RDa to RDd depending on and/or based on a condition of a second deterioration factor different from the first deterioration factor. The number of sub data groups is for example purposes only, and it may be understood that the number of data groups may be different than "4". In at least one example embodiment, the second deterioration factor may be a retention time, but is not limited thereto. In the first read voltage data group RD1, the read voltage data RD in which the retention time is a first condition Ret1 may be included in the first read voltage sub data group RDa, and the read voltage data RD in which the retention time is a second condition Ret2 may be included in the second read voltage sub data group RDb. In the second read voltage data group RD2, the read voltage data RD in which the retention time is the first condition Ret1 may be included in the third read voltage sub data group RDc, and the read voltage data RD in which the retention time is the second condition Ret2 may be included in the fourth read voltage sub data group RDd.

For example, the first condition Ret1 of the retention time may be a time smaller than a reference time, and the first and third read voltage sub data groups RDa and RDc may include the read voltage data RD evaluated under the first condition Ret1. The second condition Ret2 of the retention time may be a time of not smaller than (e.g., greater than and/or equal to) the reference time, and the second and fourth read voltage sub data groups RDb and RDd may include the read voltage data RD evaluated under the second condition Ret2, however the example embodiments are not limited thereto. The reference time may be randomly set and/or set as desired by the designer. Additionally, an improved and/or optimized reference time may be generated by applying clustering to the read voltage data RD. In at least one example embodiment, the clustering may be performed through machine learning, etc., and a dimension reduction process may be performed if desired and/or necessary, but the example embodiments are not limited thereto.

Each of the first to fourth read voltage sub data groups RDa to RDd may be used to create one variation table. A representative value of each of the first to fourth read voltage sub data groups RDa to RDd may be set to a value included in a variation table for each condition of a deterioration factor. Here, the representative value may be an average value, a center value, and/or a mode (i.e., a value that appears most often), etc., but the example embodiments of the inventive concepts are not limited thereto. For example, various values for selecting a read voltage may be set as a representative value. In addition, in the case where the created table is a variation offset table, prediction values included in the variation offset table may be set by subtracting values corresponding to a reference word line (e.g., the first word line WL1) from read voltage data.

Figure 9:
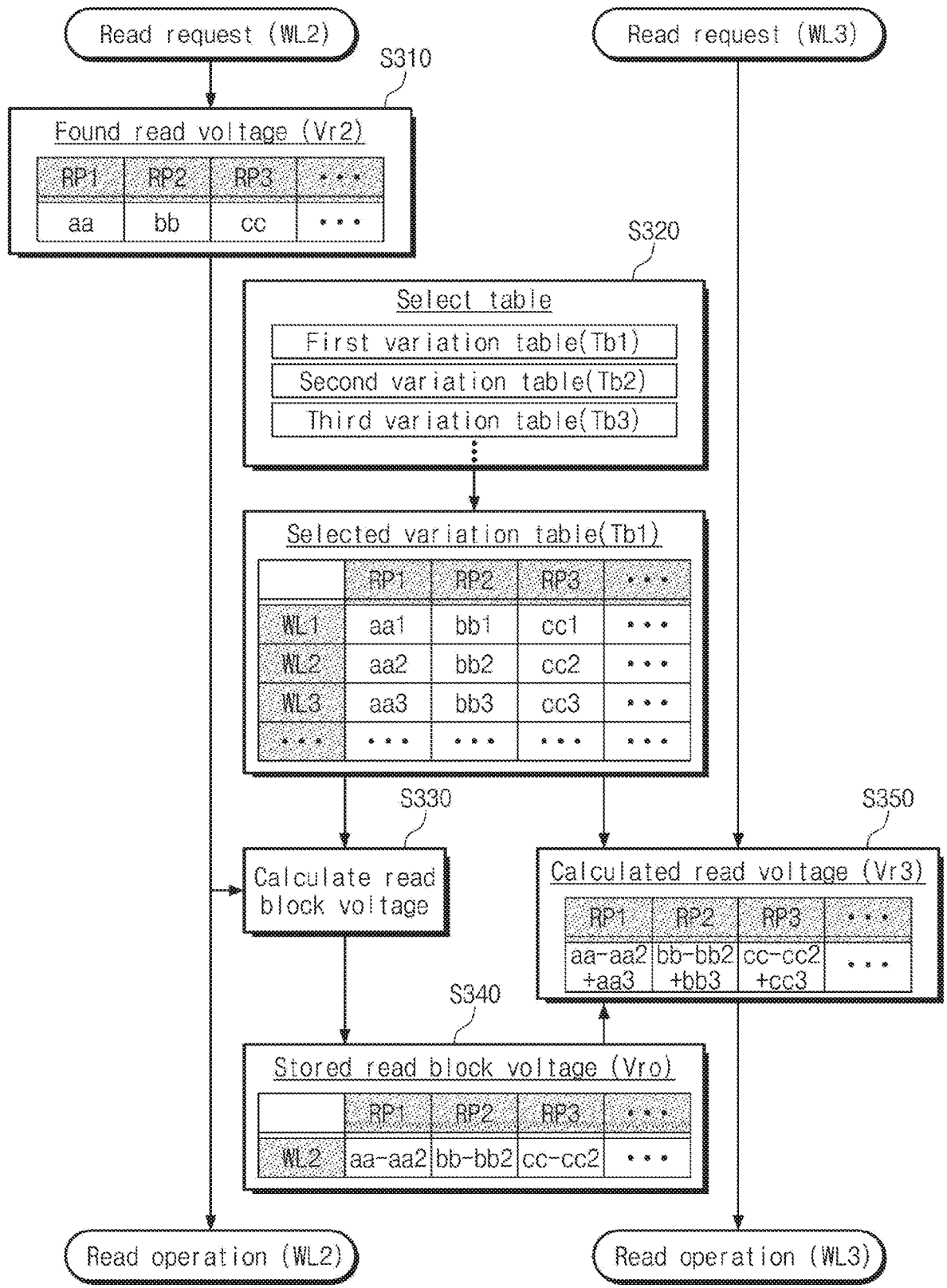
FIG. 9 is a flowchart illustrating at least one example embodiment of a data read method of FIG. 6.

FIG. 9 is a flowchart illustrating at least one example embodiment of a data read method of FIG. 6. FIG. 9 shows a method of reading data by using a plurality of variation tables Tb1 to Tb3 in the case where the plurality of variation tables Tb1 to Tb3 are created through the process of FIG. 8, however the example embodiments are not limited thereto. Referring to FIG. 9, the data read method may be performed at the memory controller 120 of FIG. 1, but is not limited thereto. It is assumed that a memory cell included in the nonvolatile memory device 110 of FIG. 1 is a multi-level cell, but is not limited thereto. A memory cell may have one of a plurality of program states, and each of the plurality of program states may be identified by using a plurality of read voltages, such as the first to third read voltages RP1 to RP3.

For convenience's sake, FIG. 9 will be described with reference to reference numerals/marks of FIG. 1.

In operation S310, a read operation may be performed on a memory region connected to the second word line WL2. It is assumed that the read operation performed on the memory region connected to the second word line WL2 is successful. It is assumed that the read voltage Vr2 corresponding to the memory region connected to the second word line WL2 is (e.g., aa, bb, cc).

In operation S320, the memory controller 120 may set the read block voltage Vro, and may select a variation table for performing the following read operation. The plurality of variation tables Tb1 to Tb3 may be created based on the process of FIG. 8. The memory controller 120 may compare the read voltage Vr2 corresponding to the memory region connected to the second word line WL2 with a read voltage of the second word line WL2, which is included in each of the first to third variation tables Tb1 to Tb3. A variation table having the most similar read voltage Vr2 may be selected based on a result of the comparison. However, the example embodiments of the inventive concepts are not limited thereto. For example, the memory controller 120 may receive a current deterioration state from the nonvolatile memory device 110 and may select a variation table satisfying a condition of the current deterioration state. In at least one example embodiment, it is assumed that the first variation table Tb1 is selected.

In operation S330, the memory controller 120 may calculate the read block voltage Vro. The read block voltage Vro may be calculated with reference to the first variation table Tb1 being the selected variation table. Operation S330 is substantially identical to operation S220 of FIG. 7, and thus, additional description will be omitted to avoid redundancy. The read block voltage Vro (e.g., aa−aa2, bb−bb2, cc−cc2) may be calculated by subtracting (e.g., aa2, bb2, cc2) being information about the second word line WL2 of the first variation table Tb1 from (e.g., aa, bb, cc).

In operation S340, the memory controller 120 may manage and store the calculated read block voltage Vro. The read block voltage Vro may be stored to the buffer memory 130. Operation S340 is substantially identical to operation S230 of FIG. 7, and thus, additional description will be omitted to avoid redundancy.

In operation S350, depending on a read request, the memory controller 120 may calculate the read voltage Vr3 of the memory region connected to the third word line WL3, based on the set read block voltage Vro and the selected first variation table Tb1. Operation S350 is substantially identical to operation S240 of FIG. 7, and thus, additional description will be omitted to avoid redundancy. The read block voltage Vro (e.g., aa−aa2+aa3, bb−bb2+bb3, cc−cc2+cc3) may be calculated by adding (e.g., aa3, bb3, cc3) being information about the third word line WL3 of the first variation table Tb1 and (e.g., aa−aa2, bb−bb2, cc−cc2).

Figure 10:
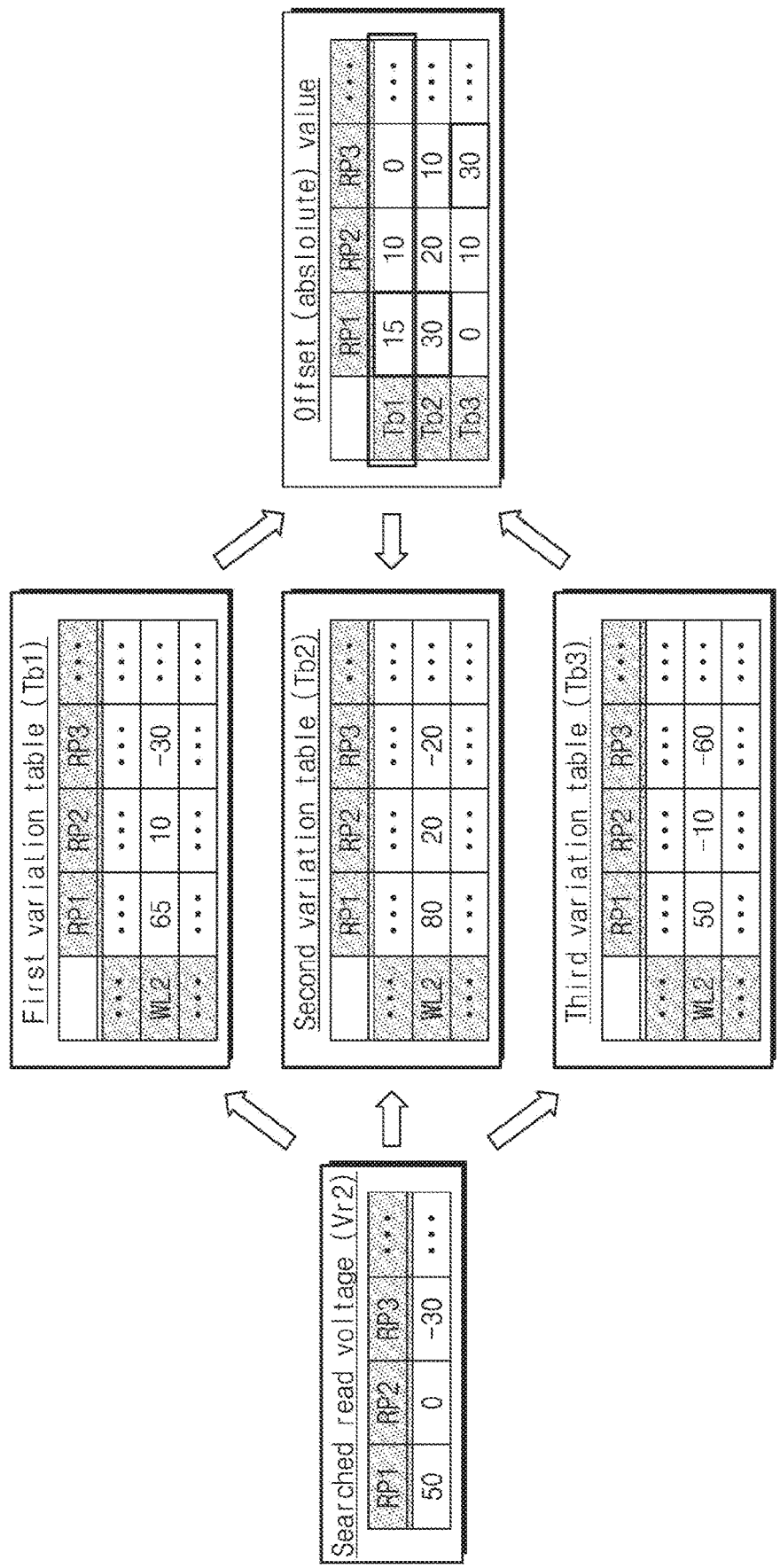
FIG. 10 is a diagram illustrating a process of selecting a variation table of FIG. 9 according to at least one example embodiment.

FIG. 10 is a diagram illustrating a process of selecting a variation table of FIG. 9. Referring to FIG. 10, the read voltage Vr2 of a successfully performed read operation and data included in the first to third variation tables Tb1 to Tb3 are illustrated as having numerical values. However, the numerical values may be understood as being set for convenience of description and are not limited thereto. The process of selecting a variation table may be performed at the memory controller 120 of FIG. 1.

The read voltage Vr2 may be compared with the first to third variation tables Tb1 to Tb3, respectively. In FIG. 8, since the read voltage Vr2 corresponds to the second word line WL2, values included in the read voltage Vr2 may be compared with values, which are included in each of the first to third variation tables Tb1 to Tb3, of a read voltage corresponding to the second word line WL2.

The memory controller 120 may calculate a result according to the comparison. The memory controller 120 may calculate differences between the values included in the read voltage Vr2 and values included in each of the first to third variation tables Tb1 to Tb3. A difference may be expressed by an absolute value. Since (e.g., 50-65, 0-10, −30+30) is obtained as a result of comparing the read voltage Vr2 and the first variation table Tb1, (e.g., 15, 10, 0) may be obtained as an offset value corresponding to the first variation table Tb1. Since (e.g., 50-80, 0-20, −30+20) is obtained as a result of comparing the read voltage Vr2 and the second variation table Tb2, (e.g., 30, 20, 10) may be obtained as an offset value corresponding to the second variation table Tb2. Since (e.g., 50-50, 0+10, −30+60) is obtained as a result of comparing the read voltage Vr2 and the third variation table Tb3, (e.g., 0, 10, 30) may be obtained as an offset value corresponding to the third variation table Tb3.

The calculated offset values may be compared for each variation table. A final variation table may be selected as a result of the comparison for the purpose of calculating the read block voltage and a read voltage according to the following read request. In at least one example embodiment, the memory controller 120 may select a variation table based on the minMax operation, but is not limited thereto. In the case of using the minMax operation, the memory controller 120 may select a maximum value of offset values of each of the first variation table Tb1, the second variation table Tb2, and the third variation table Tb3 and may select a variation table, the maximum value of which is the smallest.

Referring to FIG. 10, since the maximum values of the respective variation tables Tb1 to Tb3 are 15, 30, and 30, the first variation table Tb1 having the smallest maximum value of 15 may be selected. However, the example embodiments of the inventive concepts are not limited thereto. For example, a variation table may be selected in various manners. For example, a final variation table may be selected by calculating a cost function for each variation table.

Figure 11:
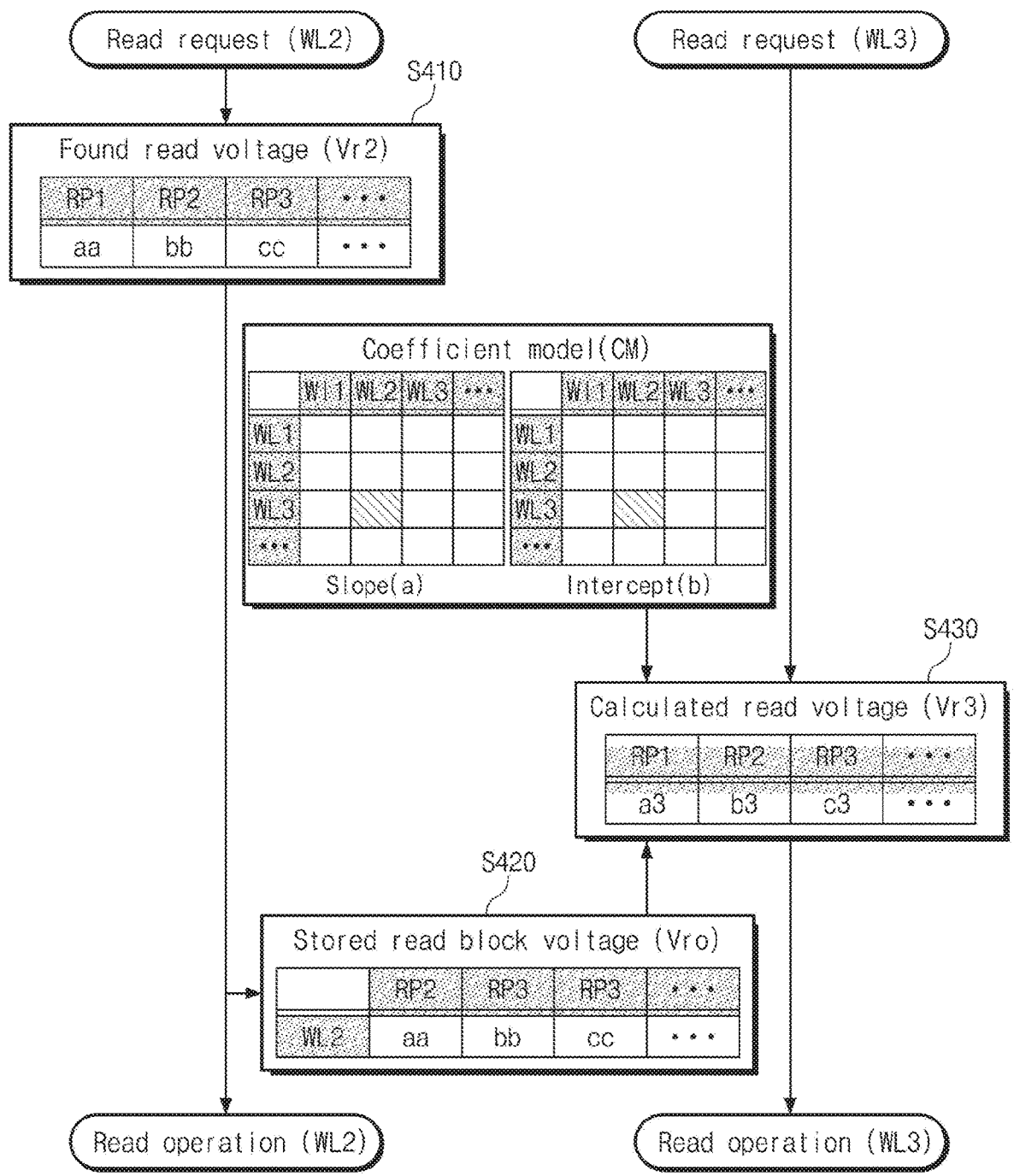
FIG. 11 is a flowchart illustrating at least one example embodiment of a data read method of FIG. 6.

FIG. 11 is a flowchart illustrating at least one example embodiment of a data read method of FIG. 6. FIG. 11 shows a method of setting a correlation of word lines according to deterioration by using an expression of relation (e.g., a desired relationship, etc.) and reading data by using a coefficient model CM for the expression of relation. Referring to FIG. 11, the data read method may be performed at the memory controller 120 of FIG. 1, but is not limited thereto. It is assumed that a memory cell included in the nonvolatile memory device 110 of FIG. 1 is a multi-level cell, but is not limited thereto. A memory cell may have one of a plurality of program states, and each of the plurality of program states may be identified by using a plurality of read voltages, such as the first to third read voltages RP1 to RP3. For the convenience of description, FIG. 11 will be described with reference to reference marks/numerals of FIG. 1.

In operation S410, a read operation may be performed on a memory region connected to the second word line WL2. It is assumed that the read operation performed on the memory region connected to the second word line WL2 is successful. It is assumed that the read voltage Vr2 corresponding to the memory region connected to the second word line WL2 is (e.g., aa, bb, cc).

In operation S420, the memory controller 120 may manage and store the read block voltage Vro. In at least one example embodiment, the read block voltage Vro is illustrated as being identical to the read voltage Vr2. However, the example embodiments of the inventive concepts are not limited thereto. For example, in the case where an offset reference is provided in the memory controller 120 as illustrated in FIG. 7 or 9, the memory controller 120 may calculate the read block voltage Vro by applying the offset reference to the read voltage Vr2, but is not limited thereto.

In operation S430, the memory controller 120 may calculate a read voltage for any other memory region based on the set read block voltage Vro and the coefficient model CM. For example, in response to a read request for a memory region corresponding to the third word line WL3, the memory controller 120 may calculate the read voltage Vr3 for the requested memory region.

The coefficient model CM may be created based on a correlation of word lines according to deterioration. The correlation of word lines according to deterioration may be defined as an expression of relation. FIG. 11 shows the case where the expression of relation is expressed by a linear expression, but the example embodiments are not limited thereto, and may be any type of expression, such as a geometric expression, etc. The expression of relation may be defined, for example, as "y=ax+b". In the expression of relation, "x" may be the read block voltage Vro, "a" may be a slope, "b" may be an intercept, and "y" may be the read voltage Vr3 to be provided according to a read request. The slope and the intercept may be set with reference to a coefficient model.

The memory controller 120 may search a slope value and an intercept value from the coefficient model CM based on a word line corresponding to the read block voltage Vro and a word line corresponding to a memory region targeted for a read operation. For example, since a word line corresponding to the read block voltage Vro is the second word line WL2 and a word line corresponding to a memory region targeted for a read operation is the third word line WL3, the memory controller 120 may extract a slope value and an intercept value corresponding to two word lines. The extracted slope value and the extracted intercept value may be applied to the expression of relation. As a result, the read voltage Vr3 may be calculated.

In the case where determining the read voltage Vr3 by using the coefficient model CM, development of changes of the read voltage may be considered in all deterioration situations. FIG. 11 is illustrated as the coefficient model CM includes a model associated with a slope and an intercept corresponding to one expression of relation. However, the example embodiments of the inventive concepts are not limited thereto. For example, various coefficient models CM may be provided for respective conditions of deterioration factors. Also, in the case where an expression of relation is a polynomial expression, the coefficient model CM may include more models depending on the number of coefficients of the polynomial expression, etc.

Referring to FIGS. 7, 9, and 11, variation information may be implemented in the form of a variation offset table Tb, a plurality of variation tables Tb1 to Tb3, the coefficient model CM, etc. Additionally, the variation information may be implemented in the form of a prediction model based on a decision tree, an artificial neural network, etc. In this case, a read voltage may be determined in consideration of a correlation between word lines not expressed by an expression of relation, and a read voltage may be determined actively during runtime. In the case of using the decision tree or the artificial neural network, a read block voltage, location information of a word line to be used to set the read block voltage, location information of a word line corresponding to a memory region to be read, etc. may be input to the prediction model. Also, a current deterioration state may be further input to the prediction model.

According to at least one example embodiment of the inventive concepts, a storage device including a nonvolatile memory device and an operating method thereof may improve the rate of success of a read operation by using variation information in which a change of an operating state due to deterioration is considered for each word line.

While the inventive concepts has been described with reference to various example embodiments thereof, it will be apparent to those of ordinary skill in the art that various changes and modifications may be made thereto without departing from the spirit and scope of the inventive concepts as set forth in the following claims.

What is claimed is:

1. A storage device comprising:
 a nonvolatile memory device including at least one memory block, the at least one memory block including at least a first memory region connected to a first word line and a second memory region connected to a second word line; and
 a memory controller configured to,
 set a read block voltage corresponding to the memory block based on a first read voltage to be applied to the first memory region,
 set variation information related to the first memory region, the second memory region, and the read block voltage based on a change of a read voltage of the first memory region and a change of a read voltage of the second memory region, and
 determine a second read voltage to be applied to the second memory region based on the variation information, wherein
 the memory block further includes a reference memory region connected to a reference word line;
 the memory controller is further configured to,
 set first offset information based on a difference between a predicted read voltage of the reference memory region and a predicted read voltage of the first memory region, and
 set second offset information based on a difference between a predicted read voltage of the reference memory region and a predicted read voltage of the second memory region; and
 the variation information includes the first offset information and the second offset information.

2. The storage device of claim 1, wherein the memory controller is further configured to calculate the read block voltage based on the first read voltage and the first offset information.

3. The storage device of claim 1, wherein the memory controller is further configured to calculate the second read voltage based on the read block voltage and the second offset information.

4. The storage device of claim 1, wherein
 the variation information includes a plurality of variation tables respectively corresponding to a plurality of conditions classified with respect to at least one deterioration factor; and
 each of the plurality of variation tables includes,
 first word line information generated based on a read voltage of the first memory region set according to the corresponding condition to each of the plurality of variation tables, and second word line information generated based on a read voltage of the second memory region set according to the corresponding condition to each of the plurality of variation tables.

5. The storage device of claim 4, wherein the memory controller is further configured to select one variation table of the plurality of variation tables based on the first read voltage and the first word line information included in each of the plurality of variation tables.

6. The storage device of claim 5, wherein the memory controller is further configured to:
calculate the read block voltage based on the first read voltage and the first word line information included in the selected variation table; and
calculate the second read voltage based on the read block voltage and the second word line information included in the selected variation table.

7. The storage device of claim 4, wherein the memory controller is further configured to:
detect a deterioration state of the memory block corresponding to the at least one deterioration factor; and
select one variation table of the plurality of variation tables based on the deterioration state.

8. The storage device of claim 4, wherein the at least one deterioration factor includes at least one of a program/erase count, a read count, a retention time, a temperature, or a read disturb of the memory block.

9. The storage device of claim 1, wherein
the variation information includes coefficient information corresponding to a desired relationship between a read voltage of the first memory region and a read voltage of the second memory region; and
the memory controller is further configured to calculate the second read voltage based on the desired relationship, the coefficient information, and the read block voltage.

10. The storage device of claim 1, wherein
the memory controller is further configured to generate prediction model information by training a desired relationship between a read voltage of the second memory region and a read voltage of the first memory region; and
the variation information includes the generated prediction model information.

* * * * *